United States Patent
Kiermasz

(10) Patent No.: US 8,594,827 B2
(45) Date of Patent: *Nov. 26, 2013

(54) METHOD OF CONTROLLING SEMICONDUCTOR DEVICE FABRICATION

(71) Applicant: Metryx Limited, Bristol (GB)

(72) Inventor: Adrian Kiermasz, Bristol (GB)

(73) Assignee: Metryx Limited, Bristol (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/719,887

(22) Filed: Dec. 19, 2012

(65) Prior Publication Data

US 2013/0149800 A1    Jun. 13, 2013

Related U.S. Application Data

(63) Continuation of application No. 12/811,855, filed as application No. PCT/GB2009/000043 on Jan. 7, 2009, now Pat. No. 8,364,302.

(30) Foreign Application Priority Data

Jan. 7, 2008 (GB) .................................. 0800227.1

(51) Int. Cl.
   *G06F 19/00*    (2011.01)
(52) U.S. Cl.
   USPC ................ 700/121; 700/110; 702/81; 73/579
(58) Field of Classification Search
   USPC .............. 700/98, 110, 112; 438/14, 41, 10, 9;
   702/81; 73/579
   See application file for complete search history.

(56) References Cited

U.S. PATENT DOCUMENTS

| | | | |
|---|---|---|---|
| 6,301,006 B1 * | 10/2001 | Doan | 356/630 |
| 6,408,220 B1 | 6/2002 | Nulman | |
| 6,623,333 B1 * | 9/2003 | Patel et al. | 451/9 |
| 7,020,577 B2 * | 3/2006 | Wilby | 702/173 |
| 7,340,372 B2 * | 3/2008 | Wilby | 702/173 |

FOREIGN PATENT DOCUMENTS

JP    2001-118762    4/2001

OTHER PUBLICATIONS

English translation of Office Action for JP Application No. 2010-541102, Aug. 20, 2013, Japanese Patent Office.

* cited by examiner

*Primary Examiner* — Kidest Bahta
(74) *Attorney, Agent, or Firm* — Stites & Harbison PLLC; Douglas E. Jackson

(57) ABSTRACT

A semiconductor wafer fabrication metrology method in which process steps are characterised by a change in wafer mass, whereby during fabrication mass is used as a measurable parameter to implement statistical process control on the one or more of process steps. In one aspect, the shape of a measured mass distribution is compared with the shape of a predetermined characteristic mass distribution to monitor the process. An determined empirical relationship between a control variable of the process and the characteristic mass change may enable differences between the measured mass distribution and characteristic mass distribution to provide information about the control variable. In another aspect, the relative position of an individual measured wafer mass change in a current distribution provides information about individual wafer problems independently from general process problems.

6 Claims, 16 Drawing Sheets

Mechanical stresses that enhance mobility for (100)/<110>
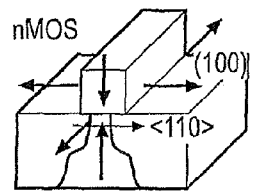
FIG. 6A
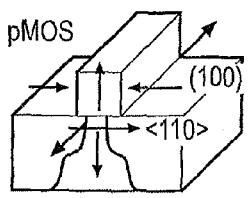
FIG. 6B
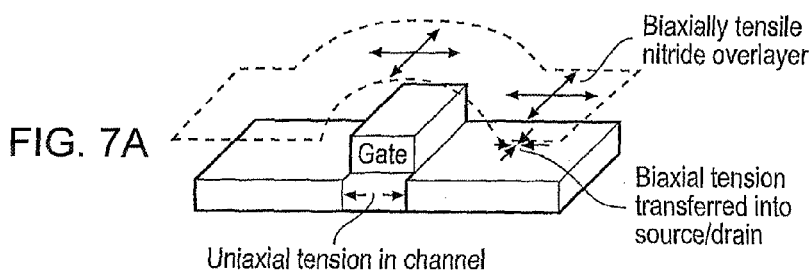
FIG. 7A
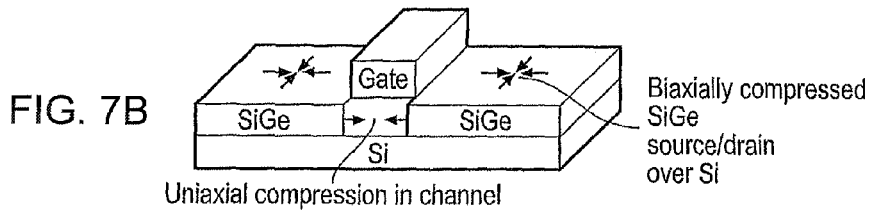
FIG. 7B
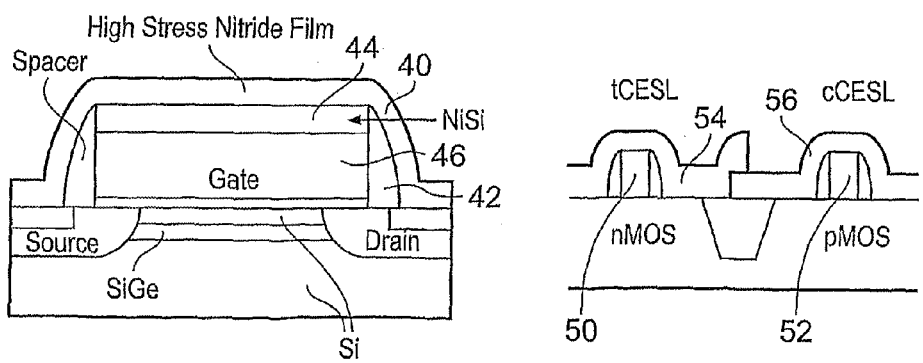
FIG. 8
FIG. 9

METHOD OF CONTROLLING SEMICONDUCTOR DEVICE FABRICATION

CROSS REFERENCE TO RELATED APPLICATIONS

This application is a continuation of application Ser. No. 12/811,855, filed Jul. 7, 2010, which is the National Stage of International Application No. PCT/GB09/00043, filed Jan. 7, 2009; which claims priority benefit of UK Application No. 0800227.1 filed Jan. 7, 2008 (which are hereby incorporated by reference).

FIELD OF THE INVENTION

This invention relates to semiconductor wafer metrology.

BACKGROUND TO THE INVENTION

Microelectronic devices are fabricated on semiconductor wafers using a variety of techniques, e.g. including deposition techniques (CVD, PECVD, PVD, etc.) and removal techniques (e.g. chemical etching, CMP, etc.). Semiconductor e.g. silicon wafers may be further treated in ways that alter their mass e.g. by cleaning, ion implantation, lithography and the like.

Depending on the device being manufactured, each wafer may be passed sequentially through hundreds of different processing steps to build up and/or to remove the layers and materials necessary for its ultimate operation. In effect, each wafer is passed down a production line. The nature of semiconductor manufacturing means that certain processing steps or sequences of steps in the production flow may be repeated in a similar or identical fashion. For example, this may be to build up similar layers of metal conductors to interconnect different parts of the active circuitry.

The cost and complexity of the processing steps required to produce a completed silicon wafer together with the time that it takes to reach the end of the production line where its operation can be properly assessed has led to a desire to monitor the operation of the equipment on the production line and the quality of the wafers being processed throughout processing so that confidence in the performance and yield of the final wafers may be assured.

A single semiconductor wafer may include many different devices manufactured by many different techniques. For example, logic and memory device may be created using CMOS fabrication methods, whilst other bipolar and compound semiconductor devices may be created using a different type of planar transistor fabrication technology. In future, several devices may be regularly fabricated together on a single chip or made separately and mounted on a common platform and connected together. Future devices may also use 3D integration techniques, where the devices are connected through the complete wafer.

It is known to use Statistical Process Control (SPC) to monitor variability in the many processes involved in fabricating a typical semiconductor device. This may involve, for any given process step, setting upper and lower limits for one or more measurable parameters which are indicative of the result of the process step based on a normal distribution and mean and measuring those parameters at one or one measurement sites on a sample (or on each) of the semiconductor wafers subject to the process step to ensure that they fall within the set limits. Ellipsometry measurements can be used for SPC purposes.

A development of SPC that is used in some process steps is Advanced Process Control (APC), which is able to use measurements to adjust the process. SPC measurements may be used as feedback to adjust a given process for subsequent wafers. Alternatively, SPC measurements may be used to feed forward information e.g. to adjust later process steps for a given wafer to compensate for variations in an earlier process step.

However, many existing metrology techniques used for SPC are limited by their ability to measure certain types of material or indeed certain processes. For example, ellipsometry can only measure optically transmissive films; it is not possible to use it with opaque films. Similarly, resistivity probes can only measure metals (not dielectrics). Furthermore, both of these techniques are limited to use with deposited layers; they cannot measure etched or recessed structures.

Another typical limitation of known SPC measurement techniques is the difficulty of measuring product wafers. In some cases, special areas (test sites) are built into the design of a wafer to check the performance of a process step. One problem with such areas is that they are not necessarily representative of what happens on real device structures and are therefore of limited value. Test wafers are an alternative solution, wherein similar processes are carried out on the test wafer structures and measured with the premise that if the process meets specification on the test wafer, then the process will meet specification on the product wafer. However, the increasing cost and complexity of wafer fabrication means that scrapped product wafers and test wafers are becoming uneconomical. Furthermore, test sites on wafers are undesirable as they use up value space, i.e. reduce the number of devices that may be fabricated, hence impacting on productivity.

In WO 02/03449 the present inventors disclosed a way to measure changes in mass very accurately when semiconductor wafers are processed. A common feature of many semiconductor device fabrication steps is that material will be added or removed. In WO 02/03449, it was suggested that SPC could be applied to deposition process steps using the accurate mass measurement method.

SUMMARY OF THE INVENTION

The present invention is a development of ideas disclosed in WO 02/03449.

As mentioned above, many wafer fabrication (e.g. wafer treatment) steps involve a change in mass of the wafer. The inventors have discovered that because each individual process is unique for a given device type and structure they can be assigned a 'mass fingerprint' e.g. corresponding to an average or expected or ideal mass change. For example, a deep silicon etch process might have a mass fingerprint of 65.53 mg (based on a mean value) and a shallow silicon etch process might only have a mass fingerprint of 3.24 mg. Even though the same processes may be used for different devices types, the mass fingerprints will change because of different, layouts in the devices and changes to the exposed etch areas.

If a given process for a given wafer type and device type is specified, then under ideal conditions (i.e. in conditions with no systematic error) its mass fingerprint will exhibit a distribution (referred to herein as a characteristic distribution) which is representative of the performed process. This is true for any process carried out during semiconductor manufacture.

However, the inventors have also realised that the relationship of a measured mass distribution to the characteristic distribution corresponding to a mass fingerprint and the location of individual measurements relative to a characteristic distribution can be indicative of properties of the device, i.e. properties of the element fabricated by the process having the fingerprint. In other words, a comparison of a measured mass change distribution for a current batch of wafers with a predetermined characteristic mass change distribution for a process may yield useful information about the process that may otherwise be difficult to detect. For example, mass measurements may be related to thickness, layer uniformity, stoichiometry, stress and refractive index. During fabrication, there will be variations in the process and for each of these parameters there will be a corresponding characteristic distribution. The inventors have understood that all of these distributions can be captured by measuring only the distribution of the mass fingerprint for the process. Moreover, if an empirical relationship between one or more parameters and the mass fingerprint is determined, it may be possible to detect behaviour of the one or more parameters from the measured mass fingerprint distribution. It may thus be possible to link the behaviour of the measured mass change distribution to a certain effect whereby adjustment of the process is targeted at corrected for that effect. Certain behaviour of the measured mass change distribution may indicate the onset of an error. In one embodiment this aspect of the invention may provide a means of detecting problems in the system which are flagged by changes in parameters that can only be measured directly in a destructive manner. The determined empirical relationship permits the evolution of a distribution of non-destructive measurements of mass change to be used to indicate behaviour of a parameter that can only be measured destructively. For example, it is not possible to perform non-destructive measurements of stress on thin SiN films formed on product wafers. However, a previously established empirical relationship between a stress distribution and its corresponding characteristic mass change may permit changes in stress to be detected as changes in a measured mass change distribution.

In practice, processes may be controlled based purely on a comparison of a measured mass change distribution with the characteristic mass change distribution, i.e. without any direct calculation or conversion to a corresponding parameter distribution. Indeed, problems such as a reactor pressure change or a need for cleaning may manifest themselves in many parameters. Such problems may be detected in the invention by comparing properties of the measured mass change distribution (e.g. skew, drift of mean, broadening or narrowing) itself with the characteristic mass change distribution to assess the process.

A particular advantage of the proposed method is that it may permit adjustments to the process to be determined and implemented before a predetermined process control limit is breached. In other words, the method may be used to identify mass measurement patterns which fall within the control limits of a given distribution but which indicate the onset of problems in the process.

Alternatively or additionally, the location of an individual mass change measurement (e.g. for a single semiconductor wafer) within a current mass change distribution may provide information about that wafer. Herein a current mass change distribution may be a mass change distribution consisting of measured mass changes of a plurality of wafers subjected to the process before the individual mass change measurement is taken. Whereas in known SPC techniques measurements of one or more semiconductors wafers are compared with static control limits, e.g. set in fixed positions relative to a characteristic distribution, in the invention the relative position of a measurement within a distribution is detected. This relative position may be indicative of problems with that individual wafer. Such problems may be independent of problems that affect the behaviour of the distribution as a whole. The invention may thus facilitate detection of problems that would otherwise go undetected. For example, in a situation where the mean of a distribution slips below the characteristic mean, a high outlier in the current distribution may fall within the control limits of the characteristic distribution and hence be deemed acceptable whereas a comparison with the current distribution may indicate that a problem with that wafer has occurred.

Remedial action may be taken to address problems detected in individual wafers, e.g. by adjusting parameters of that process to ensure that subsequent wafers do not repeat the problem (feedback) or of a future process to compensate in that wafer (feed forward). In other words, the invention may be used as part of an APC system. In one aspect, the comparison may be used to enable future process steps to compensate for variations in a given process step. In another aspect, the comparison may facilitate identification of failed or defective wafers if it is desirable to tighten a measured distribution for a given process step.

At its most general, the invention provides a metrology method for semiconductor wafer fabrication in which one or more process steps are characterised by a change in wafer mass, whereby during fabrication mass is used as a measurable parameter to implement statistical process control on the one or more of process steps. One advantage of this method is that the same measuring equipment may be used to monitor a plurality of different process steps. Changes in one or more different control variables that affect the process may manifest themselves in a measured mass change distribution. Important variables may include layer thickness, layer uniformity, stoichiometry, stress and refractive index. The invention may permit changes in these variables to be detected, either implicitly through monitoring behaviour of a measured mass change distribution, or explicitly by establishing an empirical relationship between a control variable and the characteristic mass change, whereby behaviour of the measured mass change distribution is indicative of behaviour of the control variable.

According to one aspect of the invention, there may be provided a method of statistical process control (SPC) including: obtaining a characteristic mass change distribution for a semiconductor wafer fabrication process; measuring a change in mass of a plurality of semiconductor wafers subjected to the process; comparing the shape of a measured mass change distribution consisting of the measured mass changes of the plurality of semiconductor wafers with the shape of the characteristic mass change distribution to monitor the process. This aspect may provide a way of monitoring the effectiveness of any fabrication process step by comparing a 'current', i.e. recently obtained, distribution with a characteristic, e.g. ideal, distribution to identify problems in the process. For example, the mean of the current distribution may stray from the mean of the characteristic distribution. This can be an indicator that the process is not performing efficiently and appropriate remedial action can be undertaken. An advantage of the method is that the remedial action can be taken in an efficient manner, i.e. before an unsatisfactory wafer is produced by the process but not so often as to unnecessarily disrupt the fabrication process.

In this aspect, properties of the distributions are compared rather than making comparisons using individual measurements. For example, comparing the shape of the measured mass change distribution with the shape of the characteristic mass change distribution may include detecting any one or more of relative broadening, relative narrowing or skew between the measured mass change distribution and the characteristic mass change distribution.

Alternatively or additionally, the method may include obtaining a mean for the measured mass change distribution and comparing the obtained mean with the mean of the characteristic distribution.

The measured mass change distribution at a point in time consists of a plurality of mass changes measured in a period immediately before that point in time. The measured mass change distribution may consist of a predetermined, e.g. fixed, number of measured mass changes, or all of the measured mass changes taken in a predetermined period before the point in time. The method may include periodically updating the measured mass change distribution, e.g. by selecting a more recently measured plurality of mass changes or setting a new point in time. Updating the measured mass change distribution enables its behaviour, e.g. evolution in time, to be monitored.

In another aspect, the invention may provide a method of statistical process control (SPC) including: measuring a change in mass for each of a plurality of semiconductor wafers subjected to a semiconductor wafer fabrication process; at a point in time, obtaining a current measured mass change distribution consisting of a plurality of the measured mass changes which were measured in a period immediately before the point in time; subsequently measuring a change in mass of one or more semiconductor wafers subjected to the process after the point in time; and comparing the subsequently measured change in mass with the current measured mass change distribution to monitor the process. In this aspect, the relative position of an individual measurement in a current distribution is determined. This relative position may be indicative of a problem with that particular wafer and hence may be dealt with in a different manner from problems detected by the comparison of the measured mass change distribution with the characteristic mass change distribution.

The measured mass change distribution may be obtained in the same manner as for the first aspect.

Comparing the subsequently measured change in mass with the current measured mass change distribution may include determining a difference between the subsequently measured change in mass and the mean of the current measured mass change distribution. This may permit outliers of the current distribution to be detected.

In a development of the idea, the method may include determining an empirical relationship between a control variable and the characteristic mass change of the process; and obtaining an indication of the behaviour of the control variable based on the empirical relationship and the comparison of the shape of the measured mass change distribution with the shape of the characteristic mass change distribution. The control variable may be a property of the measured wafer, e.g. relating to material added (e.g. deposited) or removed by the process, e.g. layer thickness, layer uniformity, doping concentration, moisture content, stoichiometry, stress and refractive index. Knowledge of how the behaviour of the measured mass change distribution is affected by the changes in the control variable may be used to adjust the process for subsequent wafers (e.g. if the control variable for a wafer indicates that the fabrication apparatus needs cleaning, etc.) or to alter future process steps for the wafer e.g. to compensate for variation in the control variable.

In one embodiment, the method may include using the empirical relationship to set an upper control limit and a lower control limit for mass change measurements.

The characteristic mass change distribution may result from a detailed investigation of a process before that process is incorporated into fabrication of product wafers. The investigation may involve obtaining a correlation between variations in the process and mass change. During the investigation, the variations in the process may be definitively measured e.g. using destructive techniques not suitable for product wafers. In this way the characteristic mass change distribution can be used effectively as a means to match non-destructive mass change measurements (i.e. measurements suitable for use on product wafers) with properties of the process that cannot be determined directly in a non-destructive manner. However, obtaining such links is not essential: changes in the measured mass change distribution may be linked directly through experience with problems with the process.

For example, when depositing materials (e.g. hafnium-silicon oxides) with a high dielectric constant (k) value for a CMOS gate application, the stoichiometry of the deposited layer is a key component affecting properties and behaviour of the layer. It is desirable to monitor the process in order to ensure that the deposited layer has the desired characteristics. However, since high k films are opaque they cannot be measured with ellipsometry. Moreover, where thin (e.g. approximately 3 nm [30 Å]) gate thicknesses are used, such films do not lend themselves to analysis from techniques such as X-ray Reflectivity (XRR) or Rutherford Backscattering Spectroscopy (RBS), which typically need a film thickness of at least 20 nm (200 Å). Also, these latter techniques are destructive and cannot be used on product wafers.

The present invention may be used to overcome this problem. In one embodiment an empirical relationship may be obtained between the stoichiometry and the characteristic mass change by comparing the composition of the high k film (i.e. at % of the three constituents Hf, Si and O) with the film density. Additionally, the allowable tolerance for thickness (and uniformity, etc.) for the various film compositions may be investigated. All of these factors affect the mass change distribution for the process, so based on the investigations it is possible to assign a band of mass changes which have a high probability (e.g. >95%, preferably >99%) of being caused by a process which deposits a layer with a satisfactory composition and thickness. The investigations described above may demonstrate what faults in the process can cause the mass change to lie above or below the allowed band. This can help identify a probable cause of a mass change outside an allowed band which either enables immediate identification of a non-ideal product wafer or permits correction of the problem during subsequent treatment steps. This concept may be applied to the position of measured mass changes within the allowed band, to fine-tune subsequent treatment steps. Thus, establishing the characteristic mass change distribution may involve investigating a process step to determine one or more relationships between process parameters and mass change to enable upper and lower control limits to be set.

Another example of a process to which the present invention may be applied is a gate etch. A typical tolerance value for a gate etch is less than 4 nm across a 300 mm diameter wafer. Directly observing a 45 nm gate width (e.g. using a scanning electron microscope) to decide whether the process is within a set specification is difficult, time consuming and destructive. However, since there can be 1000 km of gate length on a 300 mm wafer, a nanometre-scale change in width of the structure can provide a measurable change in mass. In this case, establishing an empirical relationship between gate width and the characteristic mass change may involve producing a number of gate etches which are observed through a scanning electron microscope (SEM) and have their mass changes measured to determine a relationship between mass change and gate width. The relationship may be expressed graphically. In a development of the idea, the relationship may even be extrapolated to gain insight on mass changes for critical dimensions whose variations are too small to be directly observed through a SEM.

Measuring the change in mass of the semiconductor wafers may include determining a difference between mass values obtained before and after the process. The mass values may be obtained by measuring the weight of each wafer in a weighing chamber and compensating for buoyancy exerted on each wafer by the atmosphere in the chamber. Compensating for atmospheric buoyancy may be achieved in any of the manners disclosed in WO 02/03449. A typical 300 mm wafer weighing about 128 g can experience a buoyancy force equivalent to about 45 mg. The magnitude of this force can vary over a relative short time by 10-20% (i.e. 4-6 mg).

The invention may be applicable to a single removal (e.g. etch) or deposition process, or a combination of process steps, since a plurality of individual steps will still exhibit a characteristic mass change distribution. For example, the invention may be applicable to various processes in the Back End of the Line (BEoL) stage of fabricating a Dual Damascene structure. The invention may also be used to monitor physical vapour deposition (PVD) of thin films (i.e. films having a thickness of less than 50 nm [500 Å]), monitor the creation of stacked films (of dielectric and/or metallic material) for gate or capacitor structures, monitor the fabrication of blind or deep trenches (e.g. in fabricating DRAM structures), or to monitor shallow etch processes or polymer removal steps. The invention may be used to monitor doping concentration (e.g. where mass change is caused by adding Ar, P or B atoms to a silicon substrate). Similarly, the invention may be able to monitor mass change caused by moisture absorption, adsorption and/or desorption from films fabricated on a substrate. The moisture content of film with a low k-value can be an important factor. In one embodiment, the invention may be used to determine the extent of thermal treatment required for a deposited dielectric material (e.g. spin-on wet materials) to bring its moisture content into a desired range. The invention may also be used to monitor a cleaning process used in device manufacture preparation, where a very thin layer (e.g. less than 1 nm [less than 10 Å]) is removed from a silicon substrate e.g. by known wet chemistry techniques. The mass change in this case may be very small, so to improve accuracy, a plurality of measurements may be taken for each wafer, and an average of those measurements used for comparison with the characteristic mass change distribution. This technique may be generally applicable for processes where the mass change is very small, i.e. at or beyond the repeatability limit of a measuring instrument.

In a further development, the method of the invention may include comparing the indication of the control variable obtained via mass metrology with information about the process, preferably information about the control variable, obtained by another (non-mass) metrology measurement. The other metrology measurement may also be non-destructive so that it can be used effectively on product wafers. Using the mass metrology technique in combination with another metrology output may enable anomalies or errors to be picked up that would otherwise remain undetected. For example, ellipsometry can be used to determine the thickness and uniformity of certain types of film. In one embodiment, ellipsometry data may show that a deposited film measured at a specific location (i.e. a flat area) is good, but the mass change measurement may not lie in the expected band, which may indicate that there is a problem at a location not measurable by ellipsometry, i.e. there may be a problem with film coverage in a gap where device fabrication is taking place. Such problems may have gone undetected if ellipsometry was used alone.

Aspects of the invention discussed above may be combined to provide a method in which distributions are compared to detect long term process problems and in which relative positions of individual measurements within a distribution are determined to detect individual problem wafers.

BRIEF DESCRIPTION OF THE DRAWINGS

Examples of the invention are described in detail below with reference to the accompanying drawings, in which:

FIGS. 6A and 6B are schematic diagrams illustrating the effect of mechanical stress in MOS materials;

FIGS. 7A and 7B are schematic diagrams illustrating how a nitride overlayer can impart stress to cause tension or compression in a MOS channel;

FIG. 8 is a cross-sectional view of a MOSFET structure with a high stress nitride film applied thereto;

FIG. 9 is a schematic cross-sectional view of stress-imparting films applied to an n-MOS and a p-MOS device respectively;

DETAILED DESCRIPTION

Further Options and Preferences

Figure 1:
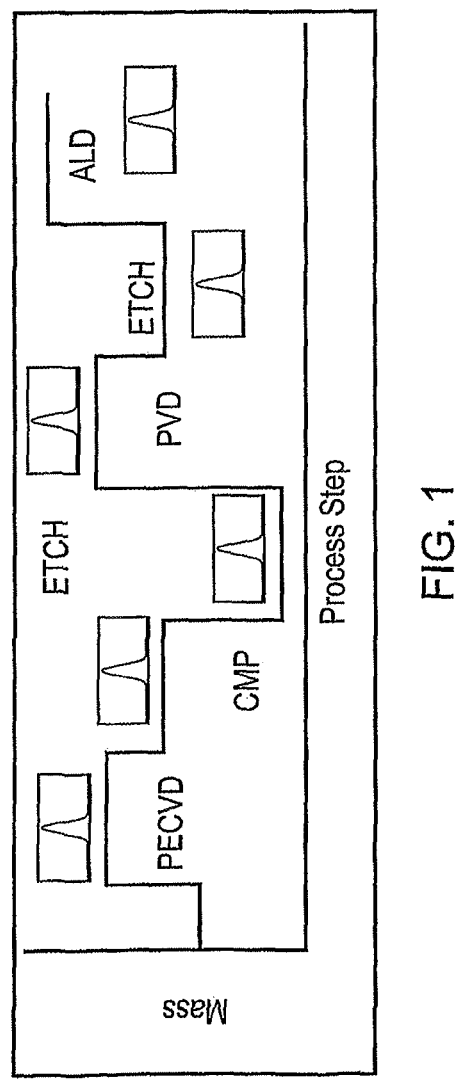
FIG. 1 is a schematic flow diagram showing mass changes associated with various processes to which the present invention may be applied.

FIG. 1 illustrates schematically the idea that every step in a semiconductor fabrication process involves a change in mass. Moreover, each process will have a characteristic mass change with its own distribution. The chart in FIG. 1 shows how the mass (on the y-axis, not to scale) of a semiconductor wafer may change according to the type of fabrication process it experiences. Thus, a plasma enhanced chemical vapour deposition (PECVD) increases mass, chemical mechanical polishing (CMP) and etch processing decrease mass, and physical vapour deposition (PVD) and atomic layer deposition (ALD) increase mass. Each of the mass changes has a different magnitude. An accurate mass measurement may be able to detect these changes to generate a measured mass change distribution for a plurality of semiconductor wafers which are treated. By comparing individual mass change measurements or the measured mass change distribution to a characteristic mass change distribution for a given process step it is possible to monitor that process.

Figure 2:
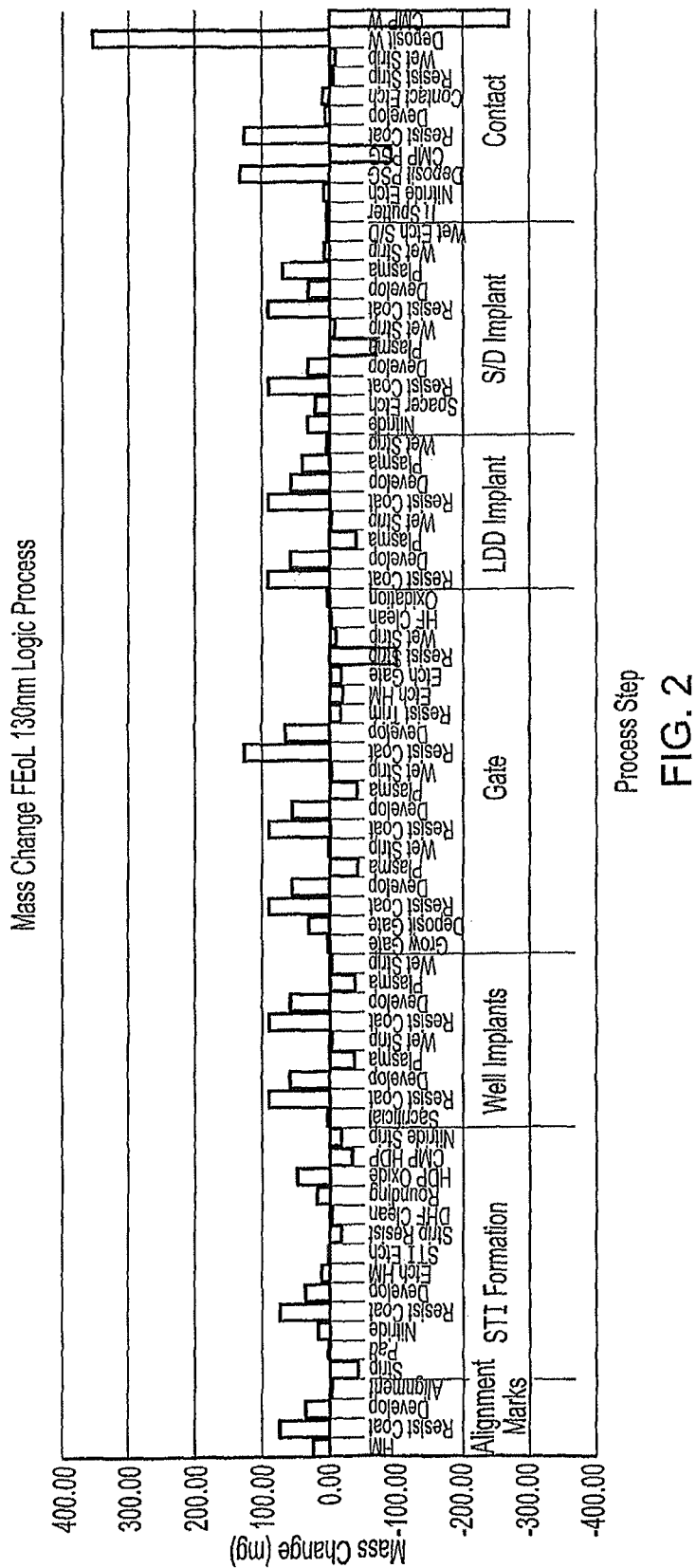
FIG. 2 is a detailed flow diagram showing mass changes associated with individual process steps in a typical front end of line (FEoL) semiconductor wafer fabrication process to which the present invention may be applied.

FIG. 2 is a similar chart to FIG. 1 but this time shows a typical process flow for a real situation, in this case a FEoL process flow for a 130 nm logic device. The inventors have realised that the same metrology technique (indeed the same metrology apparatus, if convenient) can be used to permit statistical process control (SPC) or advanced process control (APC) to be performed on each step in this process flow. This is a step beyond conventional SPC or APC, which is limited by its measurement technique (e.g. ellipsometry) to certain types of process of material.

Figure 3:
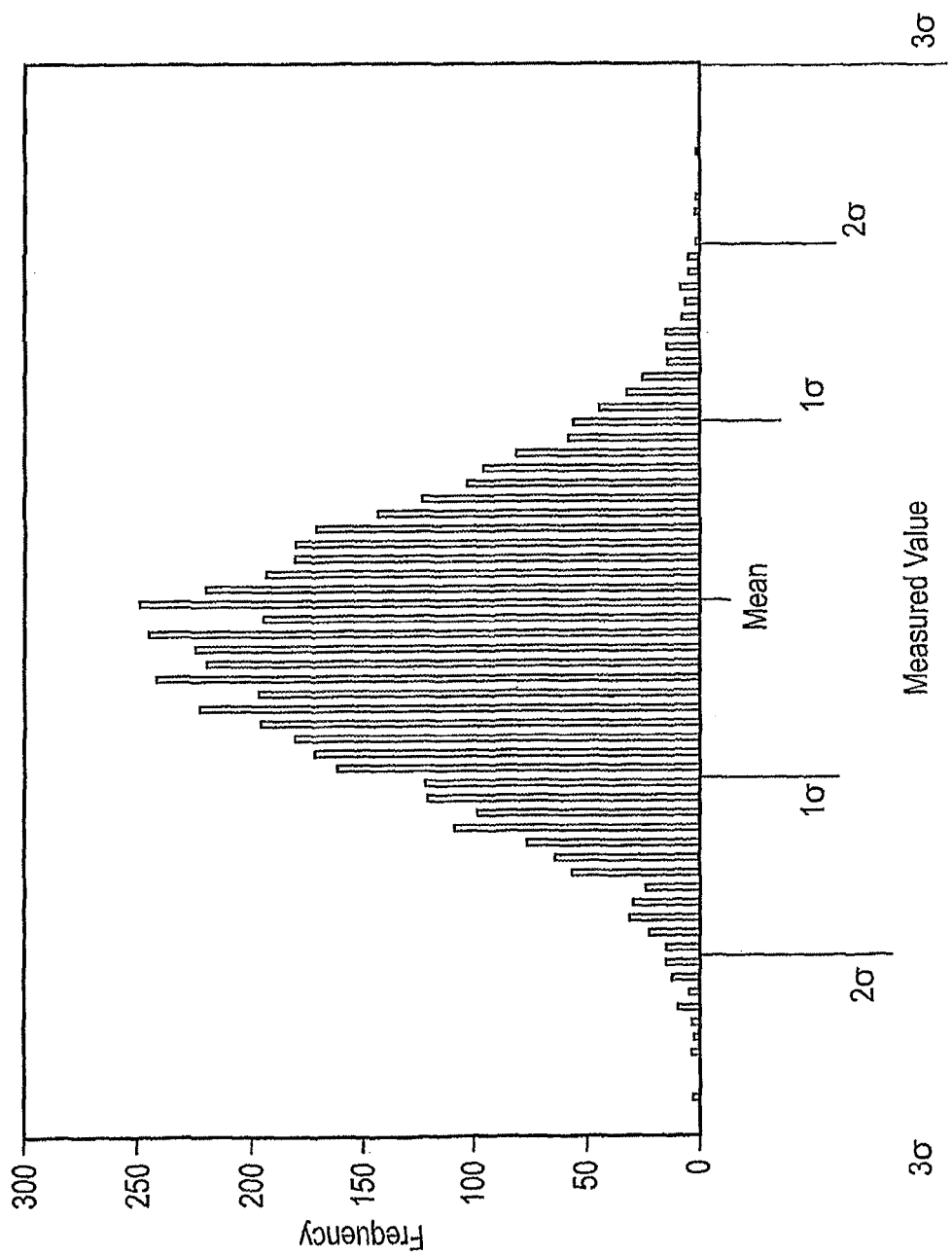
FIG. 3 is a schematic representation of a characteristic mass change distribution for use in the present invention.

Fundamentally, the process control proposed herein revolves around a comparison between a characteristic mass change distribution obtained in advance for a given process step and measured mass values taken during actual fabrication. The mass change caused by a given process will vary naturally from wafer to wafer due to random variables that cannot be controlled. The characteristic mass change distribution is representative of that normal distribution and may be obtained by experiment. FIG. 3 is a graph of data obtained from such an experiment. Measured mass change is plotted on the x-axis and frequency on the y-axis. The several thousand measurements are taken to yield a normal distribution. A mean value (i.e. a mass change fingerprint value) and the standard deviation σ may also be calculated.

Figure 4:
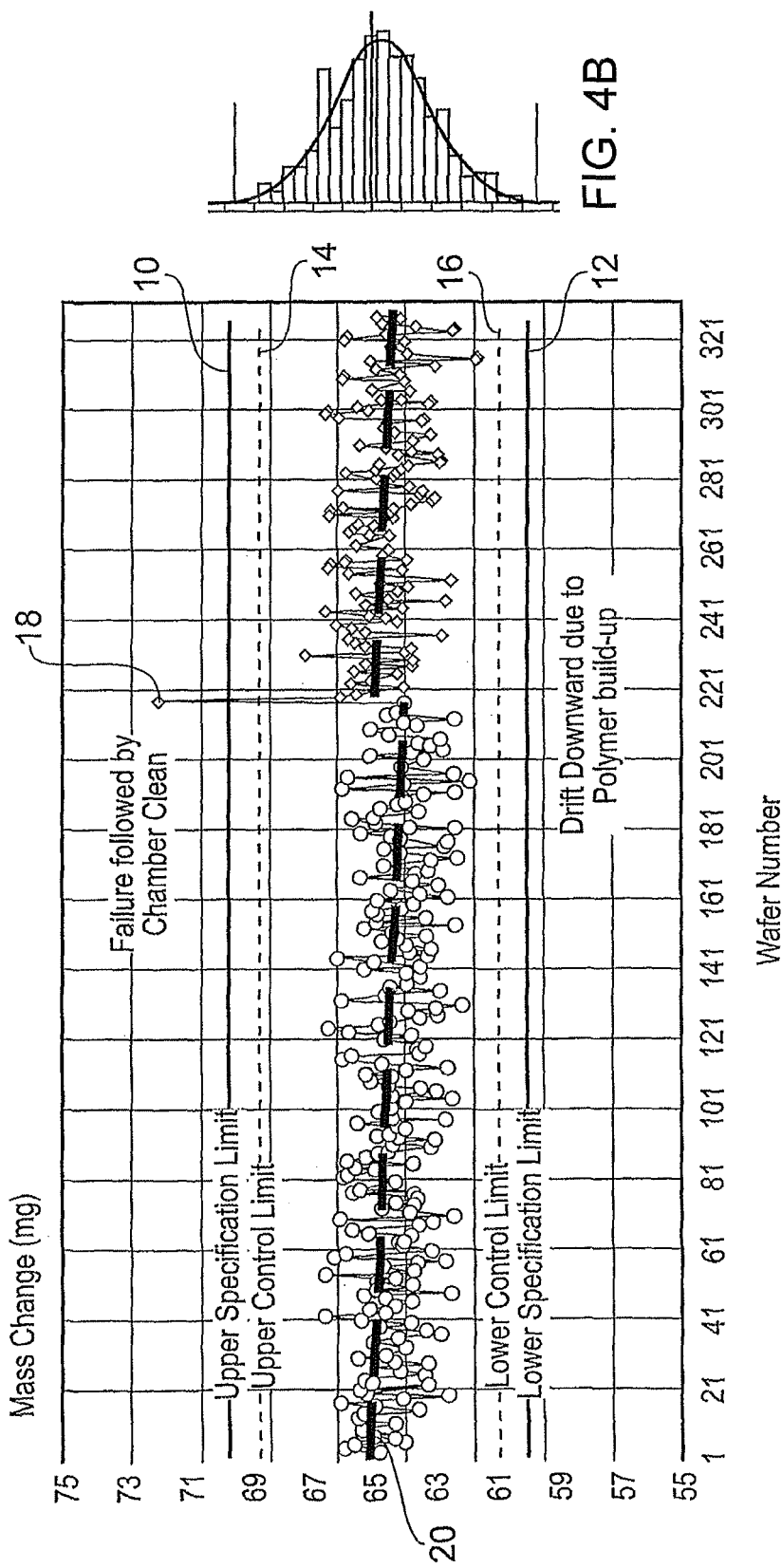
FIGS. 4A and 4B are graphs showing monitoring of a measured mass change distribution relative to a characteristic distribution that is an embodiment of the invention.

FIG. 4A is a graph showing how the characteristic mass change distribution can be used in one embodiment of the invention. In this graph real mass change measurements taken during a deep silicon etch process are plotted; the measured mass change is on the y-axis and the wafer number (in order of treatment) is on the x-axis (and with a z-axis in FIG. 4B). The plotted points therefore trace the behaviour of the actual process over time. In this embodiment, the characteristic mass change distribution is used to set an upper specification limit 10, a lower specification limit 12, an upper control limit 14 and a lower control limit 16. Each of these are mass values corresponding to certain points on the characteristic mass change distribution. For example, if the mean value of the mass change distribution is x, the upper and lower specification limits 10, 12 may be x+3σ and x−3σ respectively. The upper and lower control limits 14, 16 may be provided within the specification limits to allow a margin of measurement error. All four limits are represented as horizontal lines on the graph in FIG. 4A. In this embodiment, a measurement taken outside of the specification zone defined by the upper and lower specification limits 10, 12 (e.g. measurement 18) indicates a failure or a fault in the process step. The wafer corresponding to that measurement may be rejected. Measurements taken inside the specification zone but outside the control zone defined by the upper and lower control limits 14, 16 may be tagged for further investigation, e.g. to try to improve the measured distribution for the process.

In this embodiment it is also possible to monitor behaviour of the measured mass change distribution over time, in particular the movement of the mean measured mass change value (indicated by dashed line 20 in FIG. 4A). In this embodiment the mean measured mass drifts (the mass change is gradually decreasing over time). This may be due to polymer build up in the chamber where the process step is taking place. As shown in FIG. 4A, the chamber is cleaned following a measurement 18 indicating a failure. In a modification of this embodiment, the chamber clean may be triggered by the measured mass change mean reaching a predetermined threshold value. An advantage of this could be reduction in failure rate. Thus, it can be seen in general how process problem can been identified (and perhaps solved) using measurements of actual product wafers without scrapping any wafers and without using any test wafers.

Figure 5:
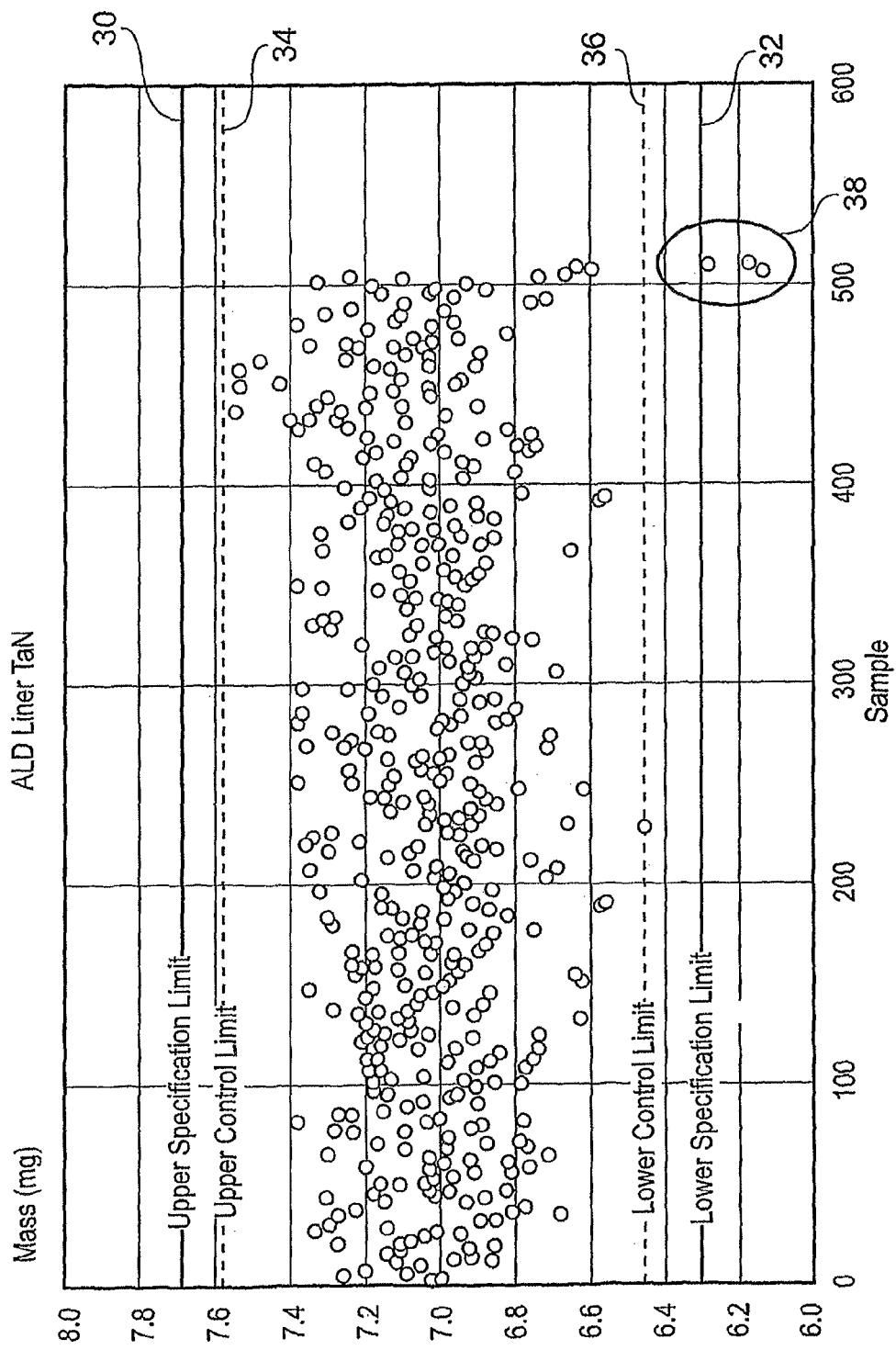
FIG. 5 is another graph monitoring of a measured mass change distribution relative to a characteristic distribution that is another embodiment of the invention.

FIG. 5 is a graph showing how a characteristic mass change distribution can be used in another embodiment of the invention. In this embodiment, the process is atomic layer deposition of a thin TaN layer. The graph plots measured mass change (y-axis) against wafer number x-axis) in the same way as FIG. 4A. The characteristic mass change distribution is used to provide upper and lower specification limits 30, 32 and upper and lower control limits 34, 36 as in FIG. 4A.

In this embodiment, a group of measurements 38 lower than the lower specification limit are measured. This may mean that the deposited layer is thinner or that the etch which produced the profile for the TaN to cover has less surface area (i.e. a previous etching step removed less material). Either way, there is a problem which has been identified on product wafers which otherwise would have gone undetected. Conventional metrology techniques provide no way to measure a 5 nm (50 Å) TaN layer on a product wafers.

In the embodiments described herein, the mass measurements may be compensated to take account of atmospheric buoyancy. Thus, the measurements may take place in an apparatus comprising a wafer holder and weighing instrument enclosed in a chamber. The wafer holder may be located in an upper portion of the chamber and the weighing instrument in a lower portion. The two portions may be partitioned (with a through hole for a connecting member) in a known manner (e.g. WO 02/03449) to reduce the volume of the wafer holder enclosure and thereby reduce air currents. The chamber may contains a temperature sensor, a humidity sensor and a pressure sensor. The sensors are mounted such that their sensing elements are located in the upper portion of the chamber, with the wafer holder. The pressure sensor may be a Druck PMP4010AB. The temperature and humidity sensors can be combined, e.g. as a Pico RH02. The measurements taken by these sensors are fed to a processing unit, e.g. an external PC or internal microprocessor, to allow the air density to be calculated, e.g. using $$\rho_{AIR} = \frac{0.3485P - 0.00132 \times (0.0398T^2 - 0.1036T + 9.5366) \times H}{(273.14 + T) \times 1000}$$

where $\rho_{air}$ is the density of air in g/cm3, P is the pressure in mBar, T is the temperature in ° C. and H is the relative humidity expressed as a percentage. The air density can be used to calculate the effect of atmospheric buoyancy on the wafer using the equation:

$$B = \frac{W_w \times \left(\frac{\rho_{air}}{\rho_w} - \frac{\rho_{air}}{\rho_c}\right)}{\left(1 - \frac{\rho_{air}}{\rho_w}\right)}$$

where B is the atmospheric buoyancy effect in grams, $W_w$ is the weight of the wafer sensed by the weighing instrument (in grams), $\rho_{air}$ is the calculated air density in g/cm3, $\rho_w$ is the wafer density in g/cm3, and $\rho_c$ is the density (in g/cm3) of a calibration weight used to calibrate the weighing instrument.

FIGS. 6 to 13 illustrate the use of the present invention to monitor the effects of silicon nitride (SiN) layers that are fabricated in the manufacture of a semiconductor device. SiN films are used for passivation of semiconductor device before they are packaged and to provide strain forces in strained gate applications. In both applications the repeatability of process performance is critical for optimum device performance. The present invention provides a monitoring technique that can be used with actual product wafers (i.e. it does not require test wafers or a test site on a product wafer) and which can identify failing devices immediately from the measurement, i.e. without requiring additional testing steps.

FIGS. 6A and 6B respectively illustrate the mechanical stresses in a conventional nMOS and pMOS devices (shown schematically) which can enhance carrier mobility in their channels. The strongly anisotropic sensitivity of mobility to strain is known. The magnitude of stress in a SiN contact etch stop layer (CESL) has a direct effect of the drive current obtainable in the channel of a nMOS or a pMOS device. The diagrams in FIGS. 7A and 7B show how a bi-axially strained nitride overlayer can transfer tension from the overlayer into the source/drain and hence into the channel. In the upper diagram in FIG. 7A the overlayer is tensile to cause uniaxial tension in the channel. In the lower diagram in FIG. 7B the overlayer is compressed to cause uniaxial compression in the channel. The magnitude and direction of the strain can be controlled through process strain engineering.

FIG. 8 is a cross-sectional view of a MOS structure in which a high stress nitride overlayer 40 is fabricated over the gate electrode 46. A cover layer 44 of NiSi and a spacer 42 separates the top and sides of gate electrode 46 respectively from the overlayer 40; the stress is transferred from the overlayer 40 to the cover layer 44 and spacer 42.

FIG. 9 illustrates schematically a cross-sectional view through a semiconductor device in which an nMOS 50 having a tensile contact etch stop layer (tCESL) 54 is located next to a pMOS 52 having a compressive contact etch stop layer (cCESL) 56.

Figure 10:
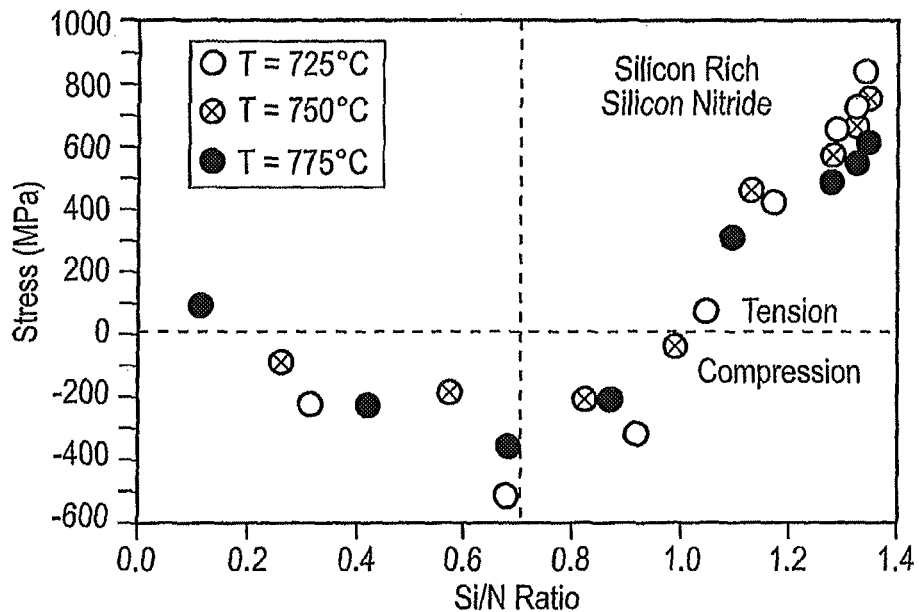
FIG. 10 is a graph showing a relationship between stress imparted and Si—N ratio of various silicon nitride films deposited at different temperatures.

The stress imparted by an SiN overlayer can be controlled to be compressive or tensile by controlling parameters of the deposition process. FIG. 10 shows the relationship between Si—N ratio and stress in a deposited SiN layer for different deposition temperatures. It can be seen that silicon-rich SiN provides can provide tensile films. However, while it is relatively easy directly to measure stress in thick films and blanket wafers, such techniques are not transferable to product wafers, which typically have much thinner SiN layers.

Figure 11:
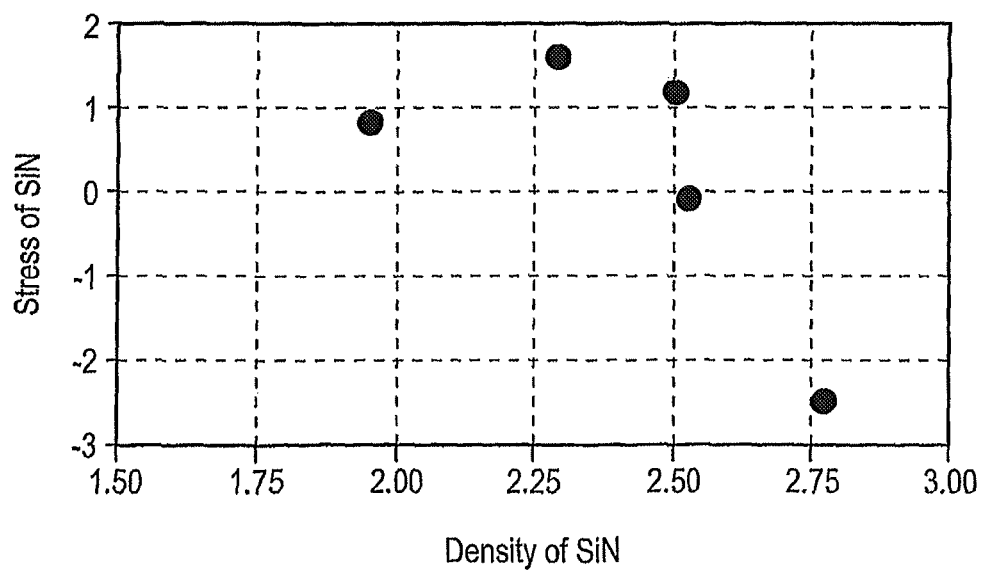
FIG. 11 is a graph showing a relationship between stress imparted and density of various silicon nitride films.

The present inventors realized that it is possible to use a relationship between stress and film density to obtain an indirect indication of stress by using the mass metrology technique of the present invention. FIG. 11 is a graph useful for determining an empirical relationship between a distribution of stress in a SiN film and the mass of that film (i.e. the mass change involved in depositing that film). The graph in FIG. 11 shows that compressive SiN films have a higher density than tensile films, which indicates that a variation in stress can be mapped onto a variation in mass. This empirical relationship may be used to provide an indication of how a change is stress is manifested in a difference in shape between a measured mass change distribution and the characteristic mass change distribution for the deposition of a SiN layer. The measured mass change distribution may be considered to be, in part, representative of the stress in the deposited film. Control limits as discussed above may be set so that measured mass changes on product wafers can be used for SPC of the SiN layer deposition.

As mentioned above, silicon nitride films are often used for passivation of a semiconductor device before it is packaged. The purpose of passivation is to minimize dark current from flowing in the static device. SiN-coated wafers have less dark current than non-passivated wafers. However, in passivated wafers dark current flow can be facilitated by the presence of hydrogen in the SiN film. Control of the deposition process can reduce the hydrogen content, but there has not been an easy way to monitor hydrogen content or dark current on actual product wafers.

Figure 12:
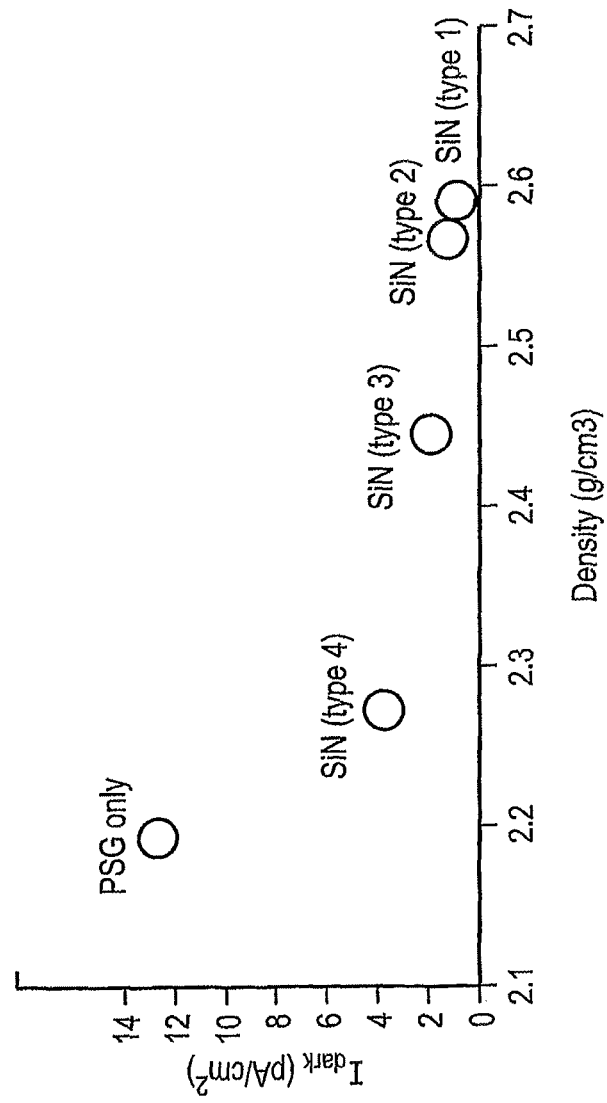
FIG. 12 is a graph showing a relationship between dark current and density of various deposited silicon nitride films.

FIG. 12 is a graph which shows a relationship between dark current and density of an SiN passivation layer. Based on this relationship, the inventors have realized that it is possible to obtain an indirect indication of hydrogen content (i.e. improved dark current inhibition) by using the mass metrology technique of the present invention. Control limits as discussed above may be set so that measured mass changes on product wafers can be used for SPC of the SiN layer deposition. The characteristic mass change distributions (and any associated control limits) for the passivation and strained layer applications may be different from each other, even though the actual process of depositing SiN is similar.

Figure 13:
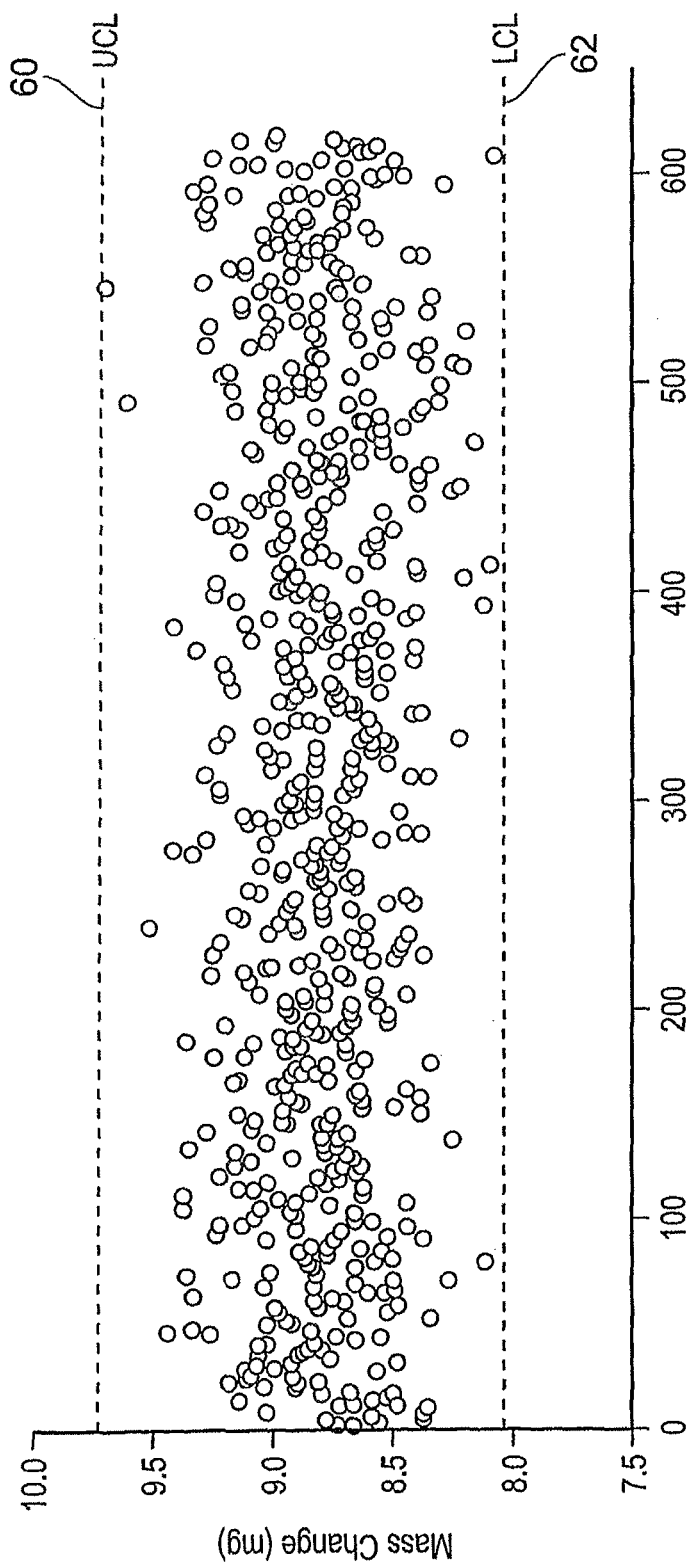
FIG. 13 is a graph showing monitoring of a measured mass change distribution for a silicon nitride film depositing step relative to a characteristic distribution that is an embodiment of the invention.

FIG. 13 is a graph showing how a characteristic mass change distribution can be used in the SiN deposition embodiments discussed above. The graph plots measured mass change (y-axis) against wafer number (x-axis) in the same way as FIGS. 4A and 5. The characteristic mass change distribution is used to provide upper and lower control limits 60, 62. This method can be used to resolve changes of 0.2 nm (2 Å) in the thickness of a SiN layer or 0.05 gcm-3 in density of such a layer.

In addition to individual measurements being assessed for the likelihood of failure (i.e. if they are outside the control limits something is probably wrong), the measured mass change distribution itself may be monitored with a view to detecting long term changes in the process (similar to the polymer build up example given above). The system may be adapted automatically to adjust for or react to detected changes, e.g. by altering deposition conditions or requiring a reset of the apparatus.

FIGS. 14 to 17 illustrate the use of the present invention to monitor the thickness of an oxide inter-metal dielectric (IMD) layer fabricated in Back End of Line (BEoL) processing.

Figure 14:
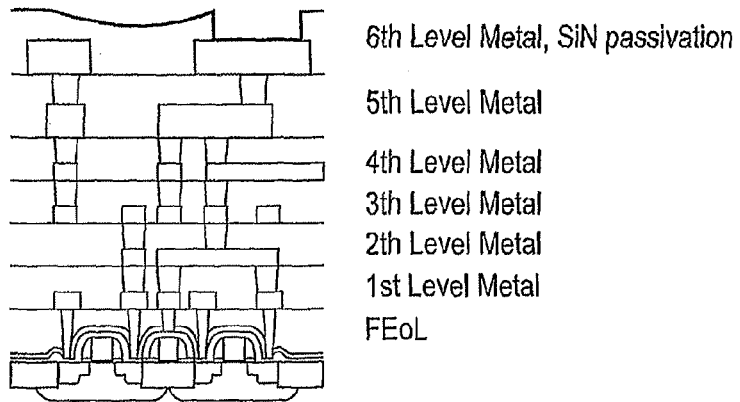
FIG. 14 is a schematic cross-sectional view through a semiconductor device the fabrication of which may be monitoring using the present invention.

FIG. 14 is a schematic cross-sectional view through a semiconductor device which has a plurality of function levels arranged on top of one another. Each function level includes a layer of metal, e.g. patterned aluminium lines. An IMD layer is provided at the interface between adjacent levels to isolate the metal layers from one another. It is desirable for the IMD layers to be thin to save space but tick enough to prevent conduction. In practice, a deposited oxide layer is subjected to chemical mechanical polishing (CMP) to reduce its thickness and generate a flat surface for use as a base for the next metal layer.

Figure 15A:
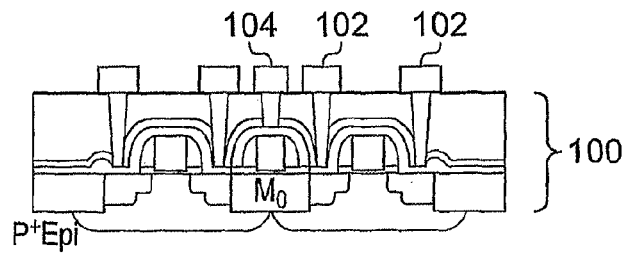
FIGS. 15A to 15C are schematic flow charts showing fabrication of an inter-metal dielectric (IMD) layer.
Figure 15B:
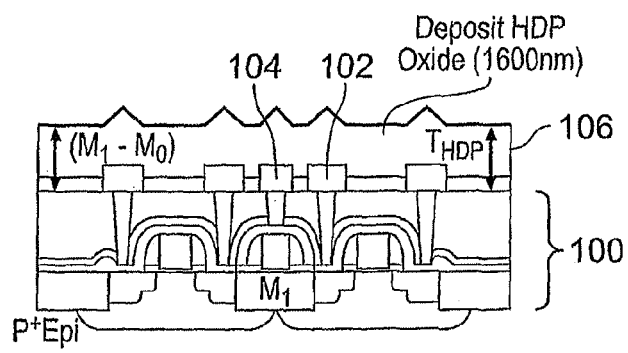
Figure 15C:
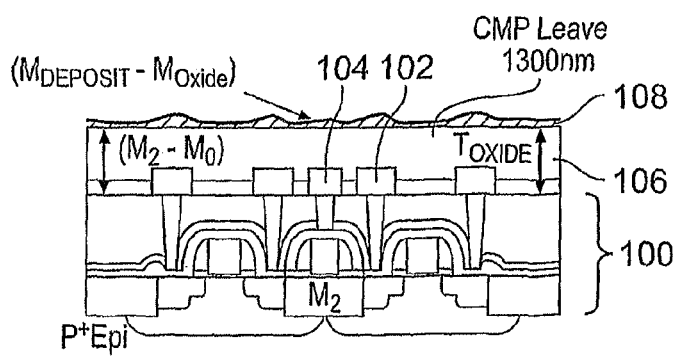

FIGS. 15A-C shows the process steps involved in fabricated an IMD layer.

FIG. 15A shows a semiconductor structure 100 that is the product of FEoL processing. Metal (e.g. aluminium) lines 102 connected to the drain and source electrode and a metal (e.g. aluminium) line 104 connected to a gate electrode are fabricated as a first metal layer. A mass measurement M.sub.0 is obtained for this intermediate structure, e.g. using the atmospheric buoyancy compensation technique mentioned above or by any other known way.

FIG. 15B shows the semiconductor structure 100 after the high density plasma (HDP) deposition of an oxide layer 106 has taken place. The deposited oxide layer 106 has a thickness $T_{HDP}$ of around 1600 nm, which completely covers the metal layer lines 102, 104. A mass measurement $M_1$ is obtained for this intermediate structure, the mass of the deposited oxide layer 106 therefore being calculable as $M_{DEPOSIT}=M_1-M_0$.

FIG. 15C shows the semiconductor structure 100 after a CMP process has removed a top portion 108 of the oxide layer 106. The treated oxide layer 106 has a thickness $T_{OXIDE}$ of around 1300 nm, which completely covers the metal layer lines 102, 104. The top surface of the treated oxide layer is flat, thereby providing a planar region for supporting subsequent layers. A mass measurement $M_2$ is obtained for this structure, the mass of the top portion 108 removed by polishing therefore being calculable as $M_{CMP}=M_1-M_2$, and the remaining oxide layer as $M_{OXIDE}=M_2-M_0$.

The final thickness of the oxide layer thus depends on two independent (and technically dissimilar) process steps. In the absence of an etch stop, it can be difficult to determine whether the correct level of oxide has been removed. Variation in the final thickness of the IMD layer can cause device integration problems and in some cases can affect the device's performance.

The mass values obtained in this process may be used to perform SPC and APC (or feed forward process control) to help identify and/or correct for potential problems. Since $M_{DEPOSIT}$ is directly proportional to the thickness of the deposited oxide layer 106, it is possible to use the position of this value relative to a characteristic mass change distribution for the deposition step to adjust the duration of the CMP step. For example, if $M_{DEPOSIT}$ is above a+1σ point on the characteristic mass change distribution, the CMP tool may instructed to increase the removal time (according at a given removal rate) for that wafer. Similarly, if $M_{DEPOSIT}$ is below a-σ point on the characteristic mass change distribution, the CMP tool may instructed to decrease the removal time. The values of $M_{OXIDE}$ may also be compared with a characteristic mass change distribution for the total IMD fabrication process (i.e. the combination of HDP deposition and CMP) to monitor the thickness of the resulting IMD layers.

Figure 16:
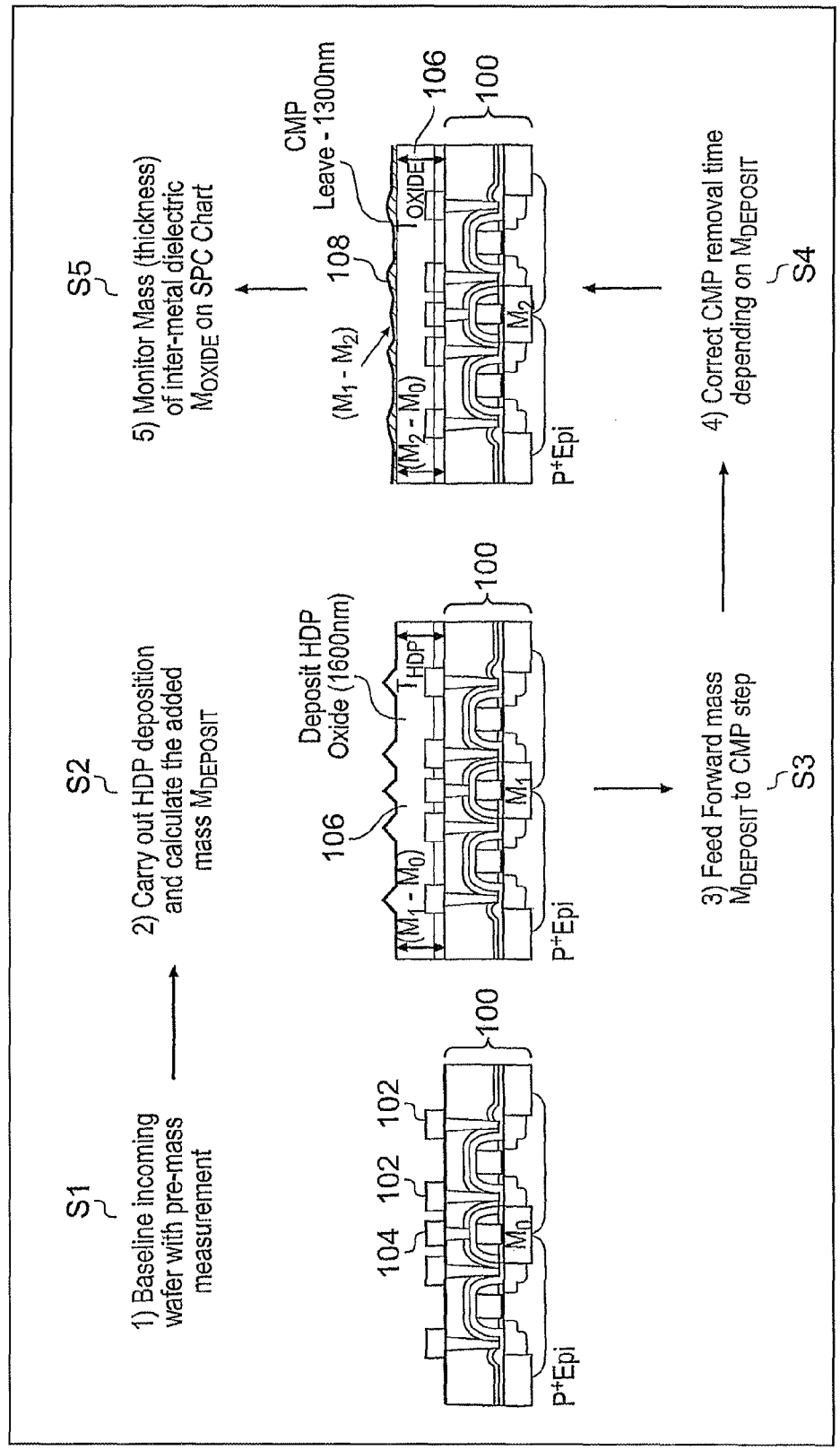
FIG. 16 is a schematic flow chart showing how the present invention can be applied to the fabrication process shown in FIG. 15.

FIG. 16 is a flow chart of an APC process similar to that outlined above. Step S1 represents obtaining the mass measurement M.sub.0 for the semiconductor structure 100 after FEoL processing. Step S2 is the HDP deposition of oxide layer 106 and subsequent measurement of $M_1$ and calculation of $M_{DEPOSIT}$. Step S3 is forward the value of $M_{DEPOSIT}$ to the CMP apparatus, where it may be compared with the characteristic mass change distribution for $M_{DEPOSIT}$ to judge whether or not to correct the CMP removal time. Step S4 is the correction of the CMP removal time (if necessary) followed by carrying out the actual CMP. Step S5 is measuring $M_2$ after completion of CMP and calculating $M_{OXIDE}$ and comparing that value with a characteristic mass change distribution for the combined HDP deposition and CMP process to monitor the thickness of the IMD layer.

Figure 17:
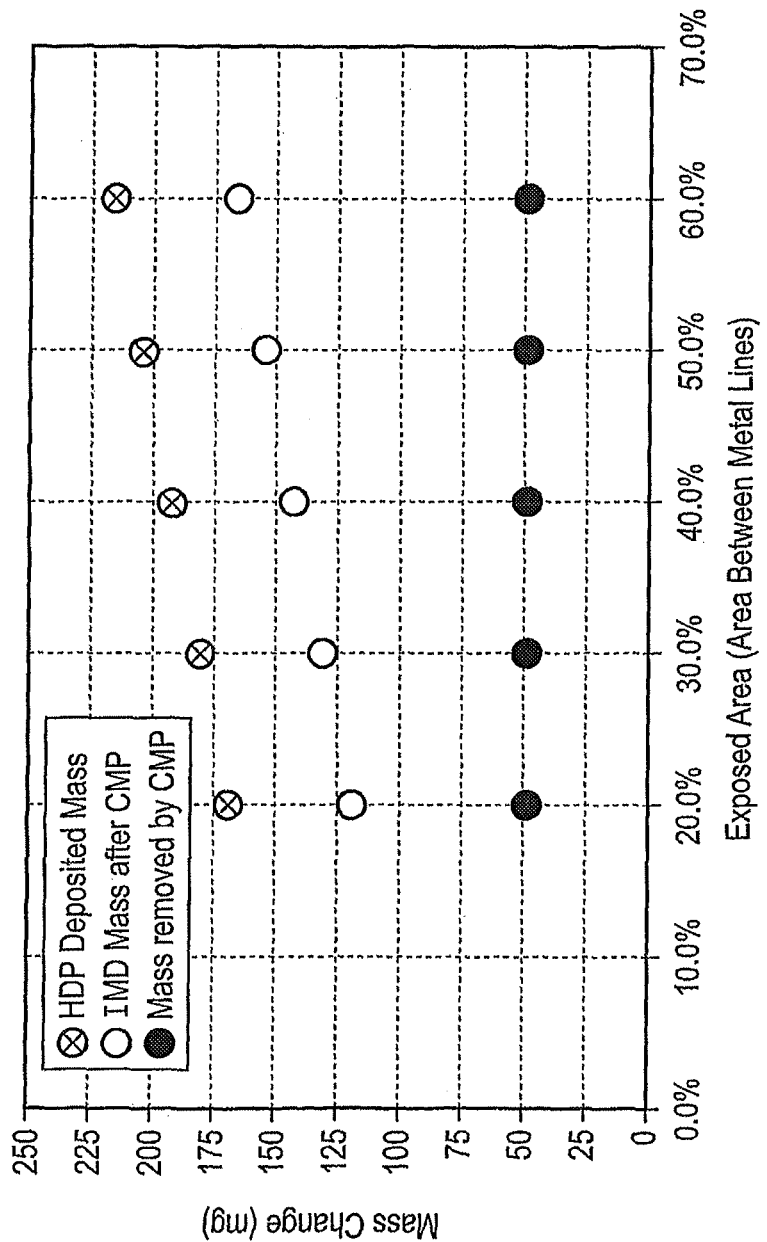
FIG. 17 is a graph showing mass changes for the process steps shown in FIG. 15 for different exposed areas.

FIG. 17 is a graph showing how deposited masses and IMD layer masses may need to vary depending on how much metal is present in the metal layer to be covered. Where there is little metal (so a large exposed area) more mass needs to be deposited to make up the difference in volume. Accordingly, each IMD layer may have its own characteristic mass distribution which in part may depend on the configuration of the metal layer which it covers. The graph in FIG. 17 shows that it may be desirable for the CMP polishing to remove a consistent amount of material. Monitoring the value of $M_{CMP}$, i.e. the relationship between $M_1$ and $M_2$ is one way to achieve this.

FIGS. 18 to 21 illustrate the use of the present invention to monitor a trench etch in a dual-Damascene process. Conventionally the etch process was controlled by an etch stop layer, but it is desirable to omit this layer to enable faster devices to be produced.

Figure 18:
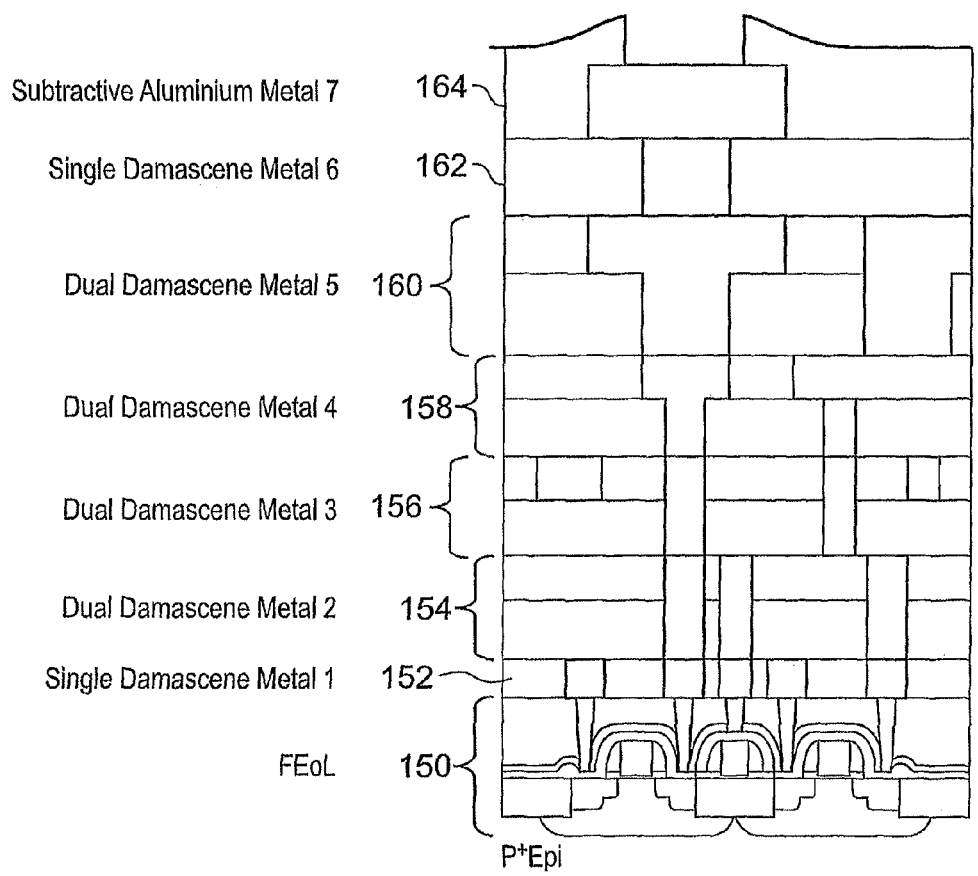
FIG. 18 is a schematic cross-sectional view through a dual damascene semiconductor device the fabrication of which may be monitoring using the present invention.

FIG. 18 is a schematic cross-sectional view through a semiconductor device which has a plurality of function levels arranged on top of one another. In this case, the base 150 of the structure is the result FEoL processing and may including one or more nMOS and/or pMOS devices. A first single-Damascene layer 152 is formed directly on top of the base 150. Four dual-Damascene layers 154, 156, 158, 160 are fabricated on top of the first single Damascene layer. A second single-Damascene layer 162 is provided on top of the dual-Damascene layers, and the structure is completed by a subtractive aluminium layer 164 on top of the second single-Damascene layer 162.

In each dual-Damascene layer two different structures (e.g. a trench between a pair of vias in dual Damascene layer 154) are etched into an insulating layer (e.g. silicon oxide). The etched structures are overfilled with metal (e.g. copper) which is then subjected to CMP to expose the insulating layer and hence reveal the conductive patterning formed by the etched structures.

Etch stop layers where conventionally used to ensure that a trench etch was performed to the correct depth, i.e. that the relative depths of a trench and via were fabricated properly.

FIG. 19 shows the process steps involved in applying the method of the present invention to the etching processes which fabricate the two different etching structures in an insulating layer as part of a dual-Damascene process. In this example, the layer being fabricated is the first dual-Damascene layer 154 shown in FIG. 18. The method is however applicable to each dual-Damascene layer. As each dual-Damascene layer may have a different configuration, the characteristic mass change distribution for the respective etch processes may be different. Comparing a measured mass change for each step with the characteristic mass change distribution may give an indication of whether the etch has been performed properly. Furthermore, APC may be performed by measuring a mass change corresponding to the deposition of the insulating layer, comparing this with a characteristic mass change distribution for that deposition process and adjusting the subsequent etch process accordingly. For example, a thinner insulating layer can be subjected to less etching whereas a thicker insulating layer can be subjected to more etching.

Figure 19A:
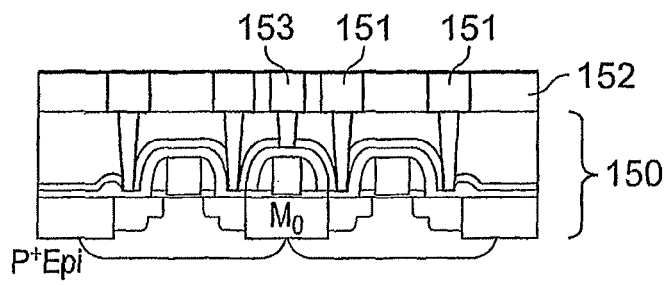
FIGS. 19A-D are schematic flow charts showing fabrication of a trench layer in the dual damascene semiconductor device shown in FIG. 18.

FIG. 19(a) shows the semiconductor base 150 that is the product of FEoL processing. The first single-Damascene layer is fabricated on a top surface of the base 150. Metal (e.g. copper) lines 151 connected to the drain and source electrode and a metal (e.g. copper) line 153 connected to a gate electrode are fabricated as a first metal layer. A mass measurement $M_0$ is obtained for this intermediate structure, e.g. using the atmospheric buoyancy compensation technique mentioned above or by any other known way.

Figure 19B:
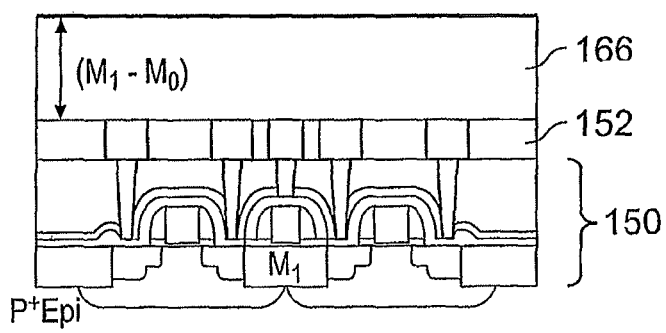

FIG. 19(b) shows the structure after the deposition of a low-k dielectric (insulating) oxide layer 166. A mass measurement M.sub.1 is obtained for this intermediate structure, the mass of the deposited oxide layer 166 therefore being calculable as $M_{LOWK}=M_1-M_0$. The value of $M_{LOWK}$ may be compared with a characteristic mass change distribution to control subsequent etching steps, as discussed with reference to FIG. 20 below.

Figure 19C:
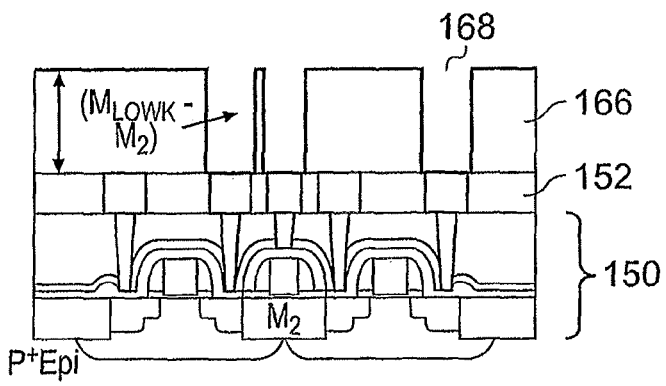

FIG. 19(c) shows the structure after three vias 168 are etched through to some of the metal lines 151, 152 in the single-Damascene layer 152. A mass measurement $M_2$ is obtained for this structure, and the mass removed by the etch may therefore being calculable as $M_{VIA}=M_{LOWK}-M_2$. The value of $M_{VIA}$ may be compared with a characteristic mass change distribution to ensure that the etch process has been performed correctly.

Figure 19D:
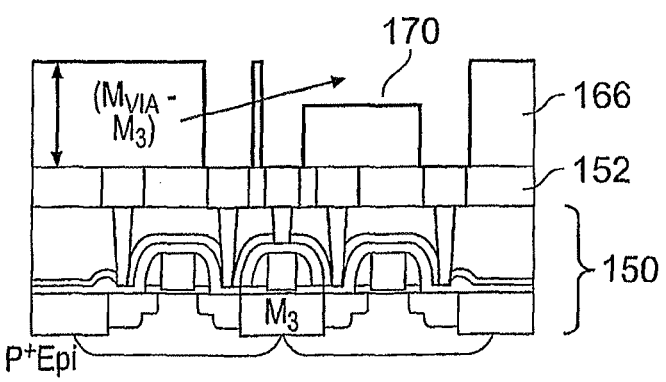

FIG. 19(d) shows the structure after a trench 170 is etched between two of the vias 168. A mass measurement $M_3$ is obtained for this structure, and the mass removed by the etch may therefore being calculable as $M_{TRENCH}=M_{VIA}-M_3$. The value of $M_{TRENCH}$ may be compared with a characteristic mass change distribution to ensure that the etch process has been performed correctly.

Figure 20:
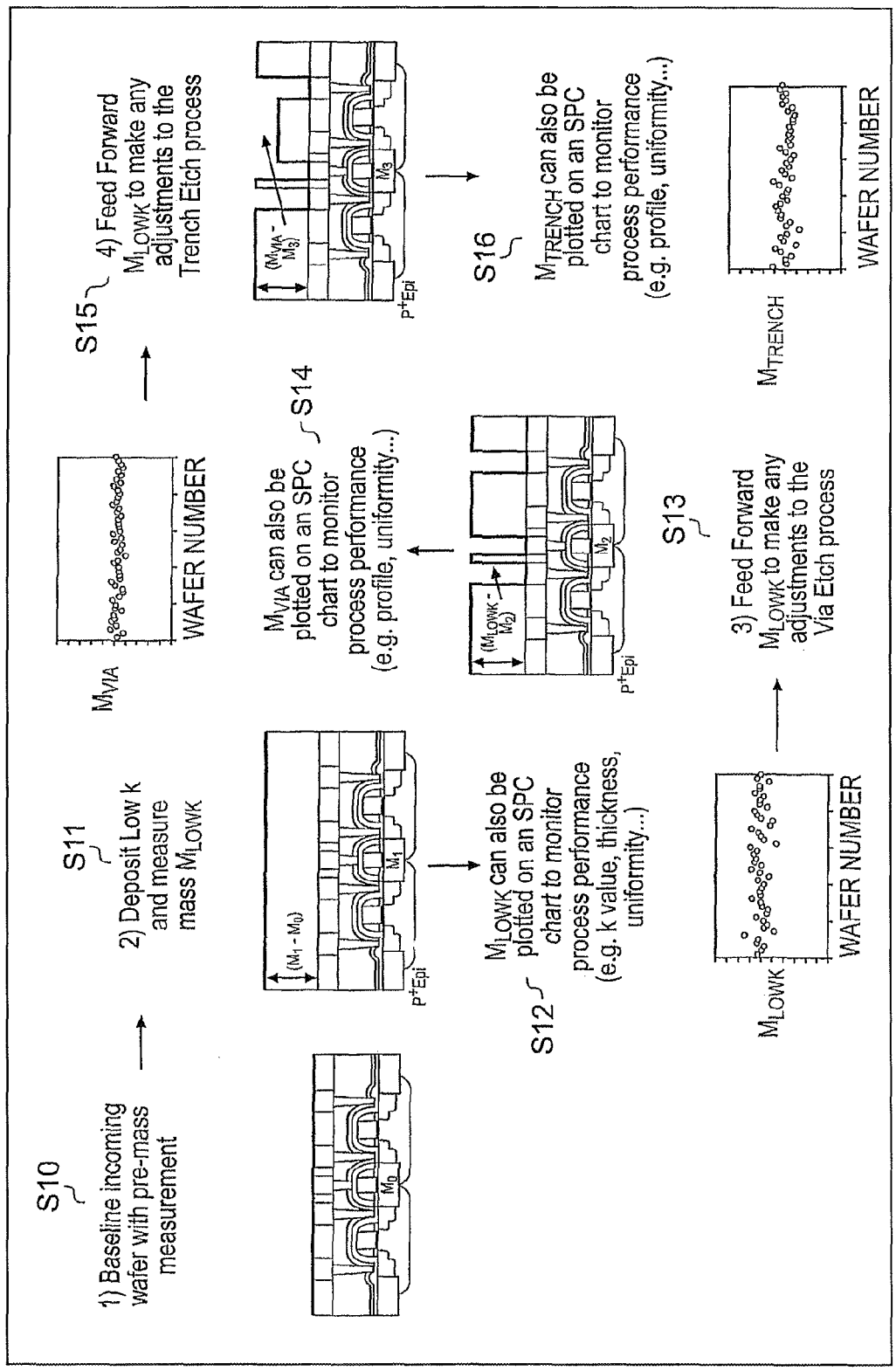
FIG. 20 is a schematic flow chart showing how the present invention can be applied to the fabrication process shown in FIG. 19.

FIG. 20 is a flow chart showing an embodiment of the invention applied to the process steps discussed with reference to FIG. 19. Step S10 is measuring a value of $M_0$ for the intermediate structure comprising the semiconductor base 150 and the first single-Damascene layer 154. Step S11 is depositing the low-k dielectric layer 166, measuring $M_1$ and obtaining (e.g. calculating) $M_{LOWK}$. Step S12 is performing SPC using the value of $M_{LOWK}$, e.g. by plotting $M_{LOWK\ LOWK}$ on a chart and comparing with a characteristic mass change distribution e.g. by comparing with control limits set according to that characteristic distribution. The relative position of $M_{LOWK}$ in the characteristic mass change distribution may be indicative of process performance, e.g. can be used to as an indicator of problems in layer thickness, k-value, uniformity, etc. Step S13 is performing first APC by feeding forward the value of $M_{LOWK}$ to adjust etch process parameters, e.g. etch timing, temperature or the like, for the via etch process. In other words, the relative position of within its corresponding characteristic mass change $M_{LOWK}$ distribution can be indicative of the thickness of the insulating layer, which is directly relating to a required etch depth. By feeding forward the information in this way, the etching process can be made more effective, i.e. fewer wafers may be lost due to failures caused by variations in fabrication. Step S14 is etching the vias, measuring M.sub.2, obtaining (e.g. calculating) $M_{VIA}$ and then performing SPC using the value of $M_{VIA}$, e.g. by plotting $M_{VIA}$ on a chart and comparing with a characteristic mass change distribution e.g. by comparing with control limits set according to that characteristic distribution. Step S15 is performing second APC by feeding forward the value of $M_{LOWK}$ (possibly also with the value of $M_{VIA}$) to adjust etch process parameters, e.g. etch timing, temperature or the like, for the trench etch process. In the same way that $M_{LOWK}$ is used as an indicator of thickness to control the via etch, it can be used in this step to control the depth of the trench relative to the vias. Step S16 is etching the trench, measuring $M_3$, obtaining (e.g. calculating) $M_{TRENCH}$ and then performing SPC using the value of $M_{TRENCH}$, e.g. by plotting $M_{TRENCH}$ on a chart and comparing with a characteristic mass change distribution e.g. by comparing with control limits set according to that characteristic distribution.

Figure 21:
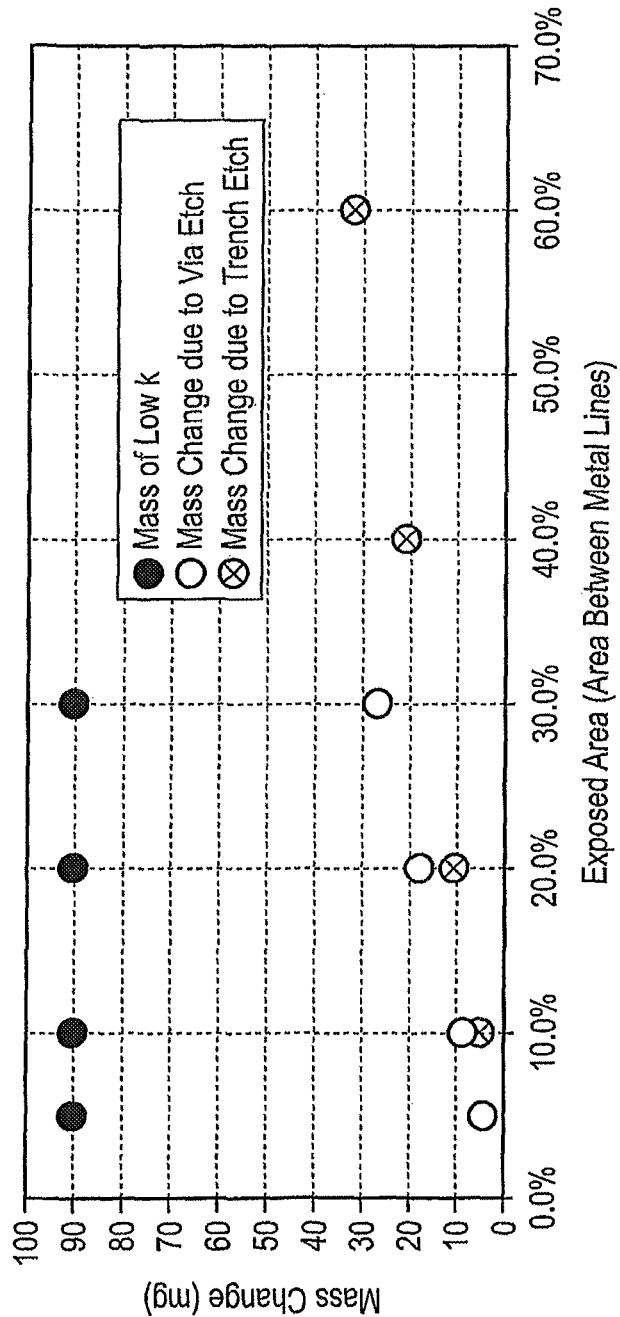
FIG. 21 is a graph showing mass changes for the process steps shown in FIG. 19 for different exposed areas.

FIG. 21 is a graph showing how mass changes for the various processes discussed above may need to vary depending on the size of the etched structures. Where the vias and trench are small less mass needs to be removed from a given insulating layer to make up the difference in volume. Accordingly, each dual-Damascene layer may have its own characteristic mass distribution which may depend on the configuration of its etched structures.

I claim:

1. A method of statistical process control (SPC) for semiconductor wafer fabrication comprising a plurality of fabrication processes, the method including the steps of:
   obtaining a characteristic mass change distribution for each one of the plurality of fabrication processes;
   measuring a change in mass for each fabrication process for one or more monitored semiconductor wafers subjected to the plurality of fabrication processes;
   comparing each measured change in mass to the characteristic mass change distribution of its respective fabrication process; and
   generating for each monitored semiconductor wafer process control data representative of the position of each measured change in mass relative to its respective characteristic mass change distribution for each one of the plurality of fabrication processes completed for that monitored semiconductor wafer.

2. A method according to claim 1, wherein obtaining the characteristic mass change distribution at a point in time for each one of the plurality of fabrication processes includes the steps of:
   measuring a change in mass for each of a plurality of semiconductor wafers subjected to the fabrication process in a period immediately before the point in time;
   generating a current measured mass change distribution consisting of the changes in mass which were measured in the period immediately before the point in time; and
   using the current'measured mass distribution as the characteristic mass change distribution for monitored semiconductor wafers subjected to the fabrication process after the point in time.

3. A method according to claim 2, wherein the current measured mass change distribution consists of a predetermined number of measured mass changes.

4. A method according to claim 2, wherein the current measured mass change distribution consists of all mass changes measured in a predetermined period immediately before the point in time.

5. A method according to claim 2, including periodically updating the measured mass change distribution.

6. A method according to claim 1 including determining whether or not a monitored semiconductor wafer is to progress to a future fabrication step based on the generated process control data.

* * * * *